United States Patent [19]

Thornburg

[11] 4,162,538
[45] Jul. 24, 1979

[54] THIN FILM PROGRAMMABLE READ-ONLY MEMORY HAVING TRANSPOSABLE INPUT AND OUTPUT LINES

[75] Inventor: David D. Thornburg, Los Altos, Calif.

[73] Assignee: Xerox Corporation, Stamford, Conn.

[21] Appl. No.: 819,310

[22] Filed: Jul. 27, 1977

[51] Int. Cl.² .................... G11C 17/00; G11C 11/34
[52] U.S. Cl. .................................... 365/96; 365/103; 365/163
[58] Field of Search .................. 340/173 SP; 365/96, 365/105, 94, 103, 163, 175

[56] References Cited

U.S. PATENT DOCUMENTS

| | | | |
|---|---|---|---|
| 3,245,051 | 4/1966 | Robb | 365/96 |
| 3,629,863 | 12/1971 | Neale | 340/173 SP |
| 3,641,516 | 2/1972 | Castrucci et al. | 340/173 SP |
| 3,810,127 | 5/1974 | Hoff, Jr. | 365/96 |
| 3,916,392 | 10/1975 | Richardson | 365/175 |

*Primary Examiner*—Bernard Konick
*Assistant Examiner*—Donald McElheny, Jr.

*Attorney, Agent, or Firm*—Irving Keschner; W. Douglas Carothers, Jr.

[57] ABSTRACT

A thin film programmable read-only memory is provided which comprises an X-Y matrix of conductors, the cross points of which are connected together by a switch element comprising a current-controlled negative differential resistance (CNDR) device in series with a semiconductor fuse. At low bias levels corresponding to read signals, the element behaves as a non-linear resistance. At large bias levels corresponding to write signals, the element will be driven to its negative differential resistance characteristic, the switching element becoming a permanent open circuit when the fuse blows. The symmetrical switching characteristics of the CNDR device allows the function of the X conductors (input or address lines) and Y conductors (output or word lines) to be transposed in that the address information can be applied to the Y lines, the output appearing at the X lines.

In an alternate embodiment, a threshold switching (TS) device is utilized in place of the CNDR device.

The current characteristics of the CNDR and TS devices are such that the fuse is blown rapidly and cleanly when the devices are appropriately biased.

14 Claims, 10 Drawing Figures

THIN FILM PROGRAMMABLE READ-ONLY MEMORY HAVING TRANSPOSABLE INPUT AND OUTPUT LINES

BACKGROUND OF THE INVENTION

Solid-state semiconductor memories (ROM's) are available in the art and have numerous applications in electronic systems and computers as random logic elements, character generators, etc. It is a characteristic of a conventional ROM that its memory content (encoded state) is determined during the device fabrication process. An alteration in the content of the memory requires expensive re-design of the device in which it is incorporated which makes ROM's impractical for incorporation in equipment with small production runs. For this reason, the programmable read-only memory (pROM) was developed. Commercially available versions of this memory are generally shipped to the user in an unencoded state. The memory content is then coded, or programmed, at the user's location which allows the user to make the necessary changes on site. The pROM is also called a "write-once" ROM because once a bit is programmed it cannot be erased.

A typical pROM incorporates an x-y matrix of conductors, the cross points of which are connected together by diodes in series with resistive fuses such as the thin film pROM shown in U.S. Pat. No. 3,245,051. Each x-line of the pROM constitutes an address, and the y-lines together constitute an output word. If no fuses have been opened, the output word will consist of all "1's". In other words, if a "read" voltage is impressed on address line X1 (assuming for example, that the pROM has four address lines and five output bits) all output bits (y1–y5) will have a voltage impressed on them. If during programming of this memory, sufficient current (the "write" current) was allowed to flow through certain selected fuses associated with address line X1, those fuses would be blown into the open or non-conducting state. Subsequent application of a read signal to address X1 would result in an output word in which the only bits with 1's in them correspond to fuses which have not been blown. The function of the diodes is to provide a solution to the well known problem of "sneak-paths" associated with matrix memory schemes. These diodes provide effective isolation between adjacent bits so that an output bit which is programmed as a "0" will not receive an erroneous "1" signal through alternate conduction paths. The pROM described in the aforementioned patent, it should be noted, is not capable of operation in a transposed mode (i.e. applying an input signal on the output lines to generate a signal or word on the input lines). Further, the fuse when blown open, will be accomplished over a relatively extended period of time which could either allow the fuse to close after extended usage or the fuse may not be cleanly opened.

The established technology of silicon integrated circuits is well suited for the fabrication of pROM's since the matrix array of diodes can be formed by conventional diffusion processes, and the fuses can be formed by vapor deposition of appropriate fuse material and many of the available pROM's are fabricated by that technology. U.S. Pat. No. 3,818,452, shows a pROM which utilizes silicon technology.

However, it would be advantageous if a pROM could be commercially fabricated using thin film technology instead of the silicon technology described hereinabove, the fabrication cost of the resultant pROM being reduced.

It would also be desirable if the pROM, when fabricated, has the capability of being transposable which allows the role of address and word lines to be interchanged, i.e. the roles of the rows and columns can be reversed providing a pROM having at least dual operative capabilities. Further, it would be advantageous if the pROM device was of the type that allows the associated fuse to be rapidly and cleanly blown when the appropriate current is applied thereto.

SUMMARY OF THE PRESENT INVENTION

The present invention provides a thin film programmable memory (pROM) device comprising an x-y matrix of spaced conductors, the cross points of which are connected by switch elements. Each switch element has the property that, at low bias levels corresponding to "read" signals, it behaves as a non-linear resistance or as a reversible switching device.

The function of the non-linearity in voltage-current characteristics is to provide protection against sneak signal paths. At large bias levels corresponding to "write" signals, each switch element has the property that it will initially show non-linear resistance behavior, and then go into a state region of negative differential resistance (CNDR device) and finally into a low resistance state region or, alternatively, rapid switching to a low resistance state (TS device). On going into either of these latter states, the switching element will then become a permanent open circuit, the fuse part thereof being rapidly and cleanly blown open. The properties of the switching elements are the same for bias signals of either polarity, which allows the pROM to be transposable.

It is an object of the present invention to provide a transposable programmable read only memory (pROM).

It is a further object of the present invention to provide a transposable thin film pROM.

It is still a further object of the present invention to provide a pROM having n-address (n-input) lines and m-bit length words (m output lines) which can be used as a pROM with m address lines to words of n-bit length.

It is a further object of the present invention to provide a transposable pROM having address lines and output bit lines, a selected output bit being treated as an input, all address lines energized by the selected output bit corresponding to outputs and going to the logical "1" or high state.

It is a further object of the present invention to provide a pROM wherein the fuse part thereof is rapidly and cleanly blown open.

BRIEF DESCRIPTION OF THE DRAWING

For a better understanding of the invention as well as other objects and further features thereof, reference is made to the following description which is to be read in conjunction with the following figures wherein.

DESCRIPTION OF THE PREFERRED EMBODIMENT

Figure 1:
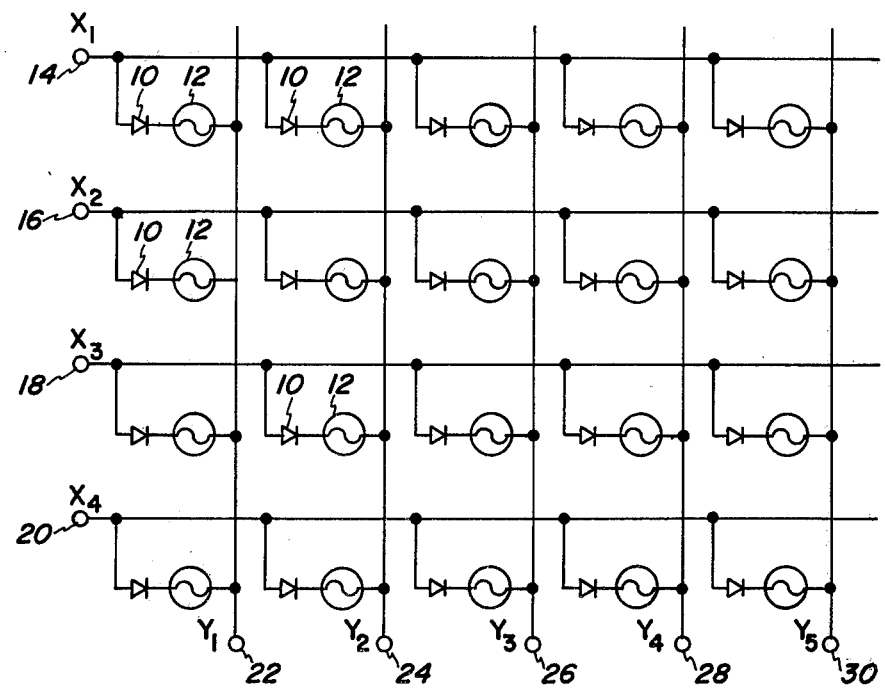
FIG. 1 shows a typical prior art pROM.

In order to put the present invention into perspective, a typical prior art pROM (as shown schematically in FIG. 1) will be described. The prior art pROM incorporates a series of mutually perpendicular X and Y conductors respectively identified as conductors X1-X4 and Y1-Y5. The cross points of each X, Y conductor are connected together by a plurality of diodes 10, which may be silicon, in series with a plurality of resistive fuses or switches 12. Each X-line of the pROM constitutes an address (the read/write address being supplied to terminals 14, 16 . . . 20 by means not shown) and the Y-lines together constitute an output word appearing at output terminals 22, 24 . . . 30. If fuses 12 have not been opened, the output word at terminal 22-30 will consist of all "1's". In other words, if a "read" voltage is impressed on address line X1 via terminal 12, all output bits at terminals 22-30 will have a voltage impressed thereon. If during programming of the memory sufficient write current is allowed to flow through selected fuses 12 associated with the X1 conductor, those fuses 12, would be blown into the open or non-conducting state. It should be noted that in the type of prior art pROM illustrated, the effect of distributed capacitance and resistance is to integrate the voltage pulse signal which is generally applied to the address terminals to blow the associated fuse. The signal thus appears as a ramp signal across the fuse. Since it is known that the faster a voltage is impressed across the fuse the more efficient the fuse is blown open, the use of diodes in the switch path causes the fuse to blow at a relatively slow rate, the possibility being the fuse has not been completely blown (or alternately, the blown fuse will reclose after the device has been utilized for a certain time period). In any event, subsequent application of a read signal to address $X_1$ would result in an output word in which the only word bits with "1's" would correspond to fuses 12 which have not been blown open. It is noted that the prior art ROM memory matrix is not transposable i.e. if a voltage corresponding to an input addressed is imposed on a selected output terminal 22, 24, 26, 28 or 30, there will be no equivalent output word on the X conductors since the diodes 10 do not have a symmetrical voltage-current characteristic.

Figure 2:
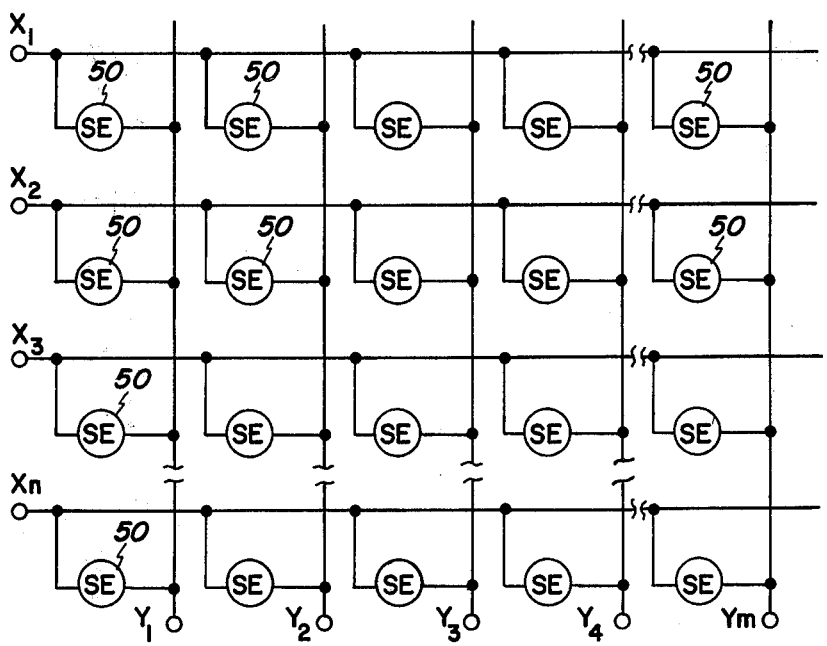
FIG. 2(a) and 2(b) illustrates a pROM matrix in accordance with the teachings of the present invention.
Figure 2B:
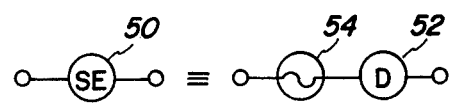
Figure 3:
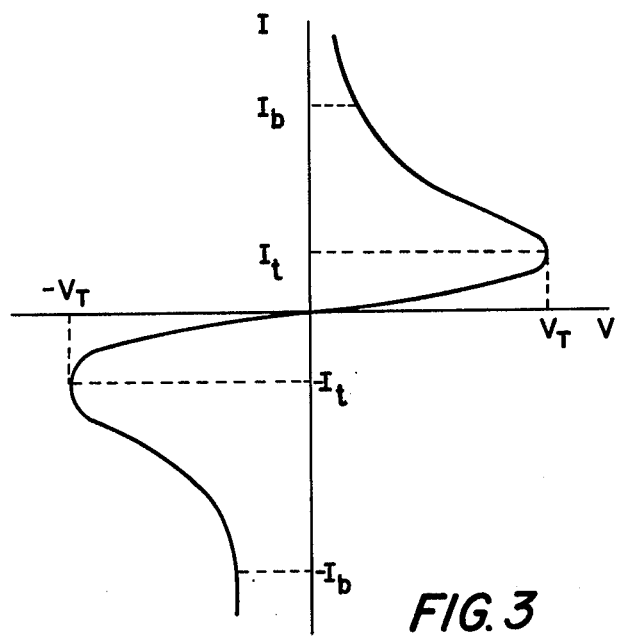
FIGS. 3 and 4 are the voltage-current characteristics of the switching device utilized in the present invention.
Figure 4:
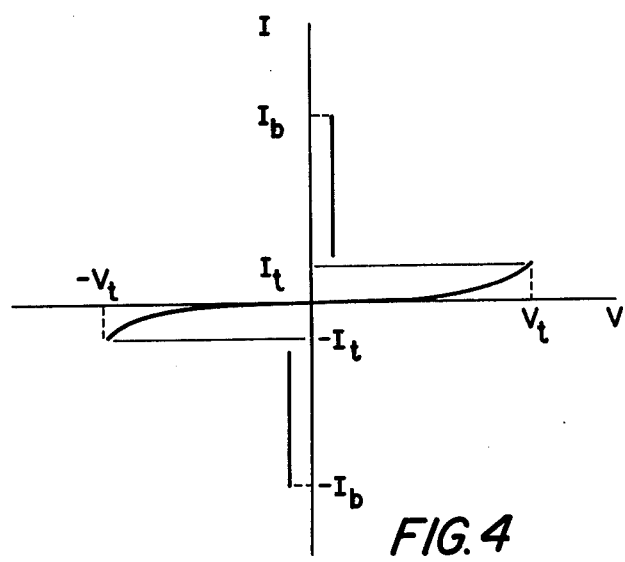

The present invention is directed to a programmable read out memory having a series of mutually perpendicular X and Y conductors respectively identified as conductors X1, X2 . . . Xn and Y1, Y2 . . . Ym, the X conductors corresponding to address inputs and the Y conductors corresponding to word outputs. The X and Y conductors cross one another when viewed in a two dimensional drawing, but the conductors do not make physical contact. Instead, each X and Y conductor is interconnected at or near their crossover point by switch elements 50 as shown in FIG. 2(a). Each switch element, described in more detail hereinafter, has the property that at low bias levels corresponding to "read signals", it behaves as a non-linear resistance or as a reversible switching device. The non-linearity in the voltage-current characteristics provides protection against "sneak-paths". In particular, as individual switching element 50 is biased, voltages will appear across adjacent switching devices as well. However, these voltages are significantly less than the voltage across a selected device. See the voltage-current FIG. 3 characteristic for example. Proper biasing can assure that no false signals will be generated by the devices not directly receiving an address signal. At large bias levels corresponding to "write" signals, the SE has the property that it will initially show non-linear resistance behavior then go into a mode of negative differential resistance and finally into a low resistance state region, or alternately, rapid switching to a low resistance state. On going into either of these states, the SE will become a permanent open circuit. In accordance with the transposable features of the present invention, the SE is selected to be symmetrical and has the same characteristics for biasing signals of either polarity. FIG. 2(b) illustrates that the SE 50 is a combination of a switching device 52 and a fuse 54. In particular, an example of an SE which is appropriate to the present invention is the combination of a current-controlled negative-differential-resistance (CNDR) device, which displays the voltage-current characteristics shown in FIG. 3, in series with a fuse which has a fusing current beyond the current at threshold, for example, at point $I_b$ shown in FIG. 3. In an alternate embodiment, an appropriate SE is obtained by replacing the CNDR device by a threshold switching (TS) device which displays the voltage-current characteristics shown in FIG. 4. As with the CNDR device SE, the fusing current of the series fuse used with the TS should be at some level well above threshold denoted by $I_b$ in FIG. 4.

An example of CNDR and TS devices which comprise a non-crystalline semiconductor such as cadmium arsenide fabricated in thin film form on a substrate, such as glass, is shown in U.S. Pat. No. 3,906,537. U.S. Pat. No. 3,979,586, assigned to the assignee of the present invention, shows an erasable optical memory array having a TS as the switch element. The teachings of the aforementioned patents necessary for an understanding of the present invention are incorporated herein by reference.

Figure 5A:
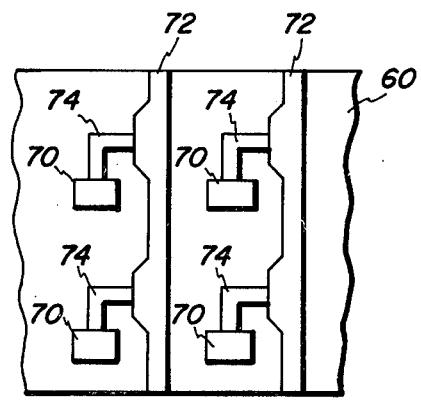
FIGS. 5(a)–5(c) illustrate the fabrication of the element of the present invention.
Figure 5B:
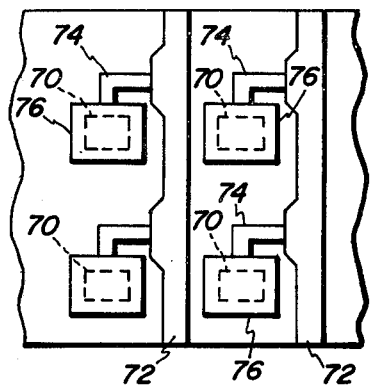

Selection of appropriate CNDR or TS device parameters (electrode area, semiconductor film thickness) allows selection of the threshold voltage and current in the fuse suitable for use in this invention being similar to those used in commercially available pROM's. The fabrication of a switching element 50 is described hereinafter with reference to FIGS. 5(a)-5(c) as follows:

(a) a suitable resistive film such as nichrome ($NiC_R$) is deposited to the desired sheet resistivity Rs (100 Ω/□ for example) on a suitable insulating substrate 60, such as glass;

(b) a layer of conducting metal of approximately 1 micron thickness, such as aluminum, is vacuum deposited on the resistive film;

(c) aluminum contact pads 70 and the desired vertical electrode patterns 72 are then etched;

(d) nichrome resistive fuses 74 are then etched;

(e) an appropriate semiconductor film, such as a 1 μm thick layer of amorphous cadmium arsenide (a-Cd $As_2$), is then vacuum deposited on the assembly;

(f) a-Cd $As_2$ is then etched so it remains (remainder portions are labeled 76) over certain aluminum conductors 70 (FIG. 5(b);

(g) a thin layer of insulating material 80 (e.g. organic film such as GAF PR-514 polyimide photoresist, or inorganic insulators such as silicon dioxide (Si $O_2$), magnesium fluoride (MgF2), etc.), is then vacuum deposited;

(h) open holes 82 are then etched over each of the a-Cd As2 locations;

(i) a layer of aluminum approximately 1 μm thick is then vacuum deposited; and (j) the aluminum is then etched into horizontal conductors 84 centered over the array of holes in the insulating layer 80.

Figure 5C:
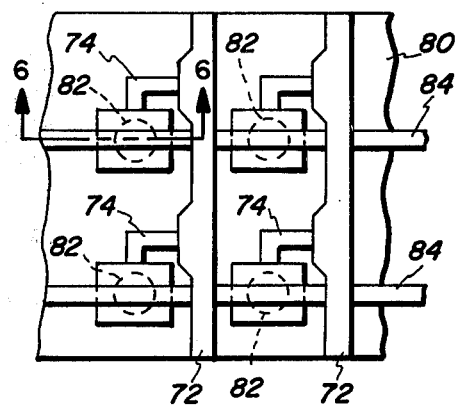
Figure 6:
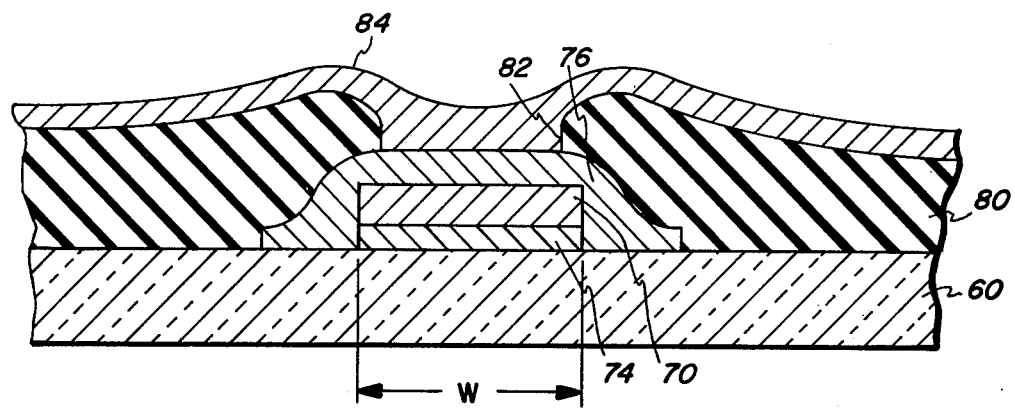
FIG. 6 is a sectional view through line 6—6 of FIG. 5(c)

FIG. 6 is a sectional view of one-cross over point taken along section line 6—6 of FIG. 5(c) and shows the structure thereat.

When a large current (I) is applied to the fuse 74 by applying an appropriate voltage to the X or horizontal conductors, the fuse 74 will be heated by the production of Joule heat. The fuse temperature rise will be proportional to the dissipated power per unit area, Pd, given by $$P_d = I^2 R_s / w^2$$

in which w is the width of the fuse. The fuse will open if the fuse temperature reaches the melting point of the fuse material. Different fusing currents can be selected by varying $R_s$, w, or both. Another mechanism of fuse blowing is electromigration of the fuse material caused when extremely large current densities are present.

The use of very thin (high $R_s$) fuses tends to increase the importance of this latter mechanism. As can be seen by the V-I characteristics of FIGS. 3 and 4, when the switch device is driven by the applied voltage source into its low resistance condition, a rapid current surge is generated in the device and the fuse, associated therewith, is opened rapidly, thereby avoiding the possibility of a partial opened switch. Further, if the device is driven to destruction, the device becomes shorted and additional voltage (current) is applied to the fuse to further ensure that the fuse is cleanly opened.

By combining both the fuse and CNDR or TS device technologies described hereinabove, the pROM of the present invention can be fabricated in monolithic form. This results in significant potential cost advantages over pROM's using silicon technology because the substrate for the present pROM can be glass or some other inexpensive insulating material, rather than expensive single crystal silicon. Further cost advantage results from the fact that the thin film technology used for the pROM of the present invention does not require as many processing steps nor as pure materials as are encountered in silicon technology. During the fabrication process, means are also provided for making external connection to the address lines (e.g. rows) and word lines (e.g. columns) of the device. Because the characteristics of both the CNDR and TS device and the fuse are selected to be polarity independent, it does not matter which set of lines are used for the address or word functions.

Under normal operation, electrical selection of an address line results in the contents of the selected address being presented to the output lines. In the transposed mode of operation, a selected output bit can be treated as an input, and all address lines in concert are treated as outputs. Electrical addressing of a particular bit of an output word results in all address lines which access this bit going into the high or logical "1" state. Another application of the transposable feature is that such a pROM with n-address lines to words of m-bit length can also be used as a pROM with m address lines to words of n-bit length.

In other words, the pROM of the present invention has a dual capability of providing a variable bit length output word depending upon how the pROM is addressed.

Figure 7:
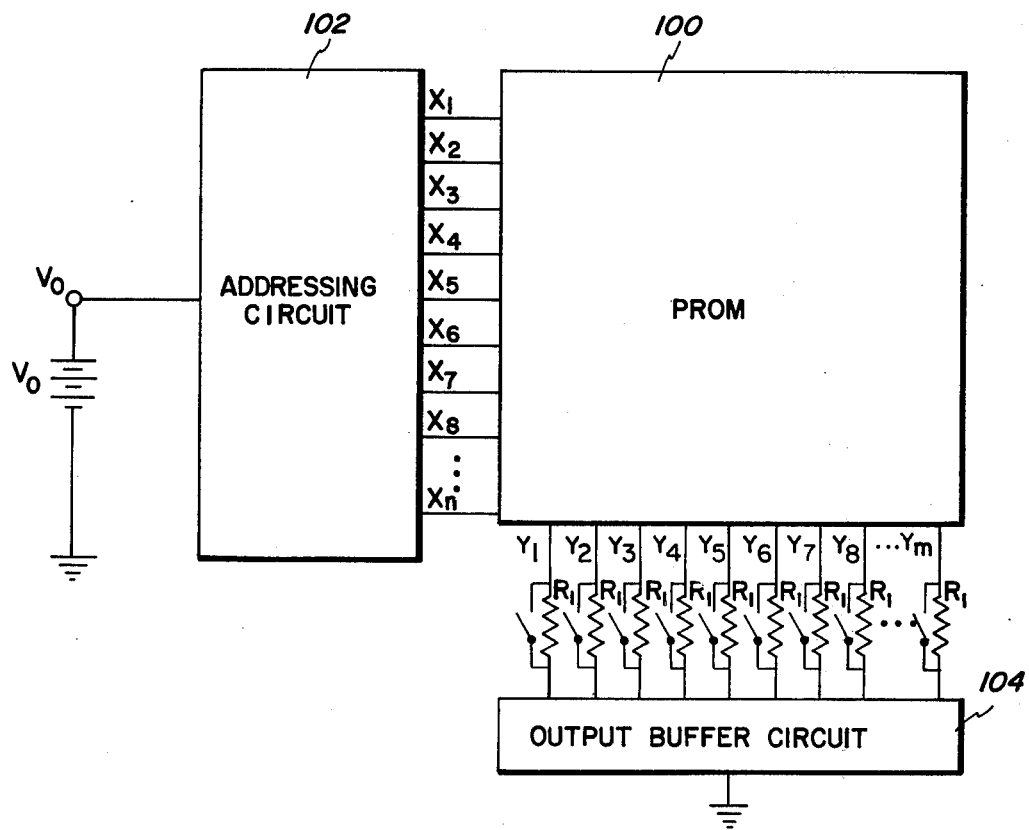
FIG. 7 is a block diagram of the addressing and output buffering means utilized with the transposable pROM of the present invention.

For purposes of programming and reading the pROM 100 of the present invention, it must be connected to addressing and output buffering circuits 102 and 104, respectively; as depicted in FIG. 7. The function of the addressing circuit 102 is to provide a low impedance "high" voltage signal of magnitude $V_o$ and either polarity to the desired address line X1, X2 ... Xn the other lines being kept in a zero voltage "open" state. Suitable addressing circuits include a plurality of normally open switches each having one side connected to a voltage source and the other side connected to an individual address line of the pROM 100. An alternative addressing circuit involves replacing the switch with an emitter follower circuit, or other suitable circuit which should be apparent to those versed in the art of digital circuit design. The output circuitry 104 may include a plurality of load resistors of value $R_1$, for example, each of which is connected between an Y1, Y2, Ym of the pROM 100 and circuitry 104. For purposes of writing into the pROM 100, each resistor should also have a switch across it so that R1 can be reduced to a very low value. It is to be understood that this switch may be a mechanical switch, a transistor or other scheme which may be apparent to those skilled in the art of digital circuit design. The output signals may be sensed as voltages at each of the nodes between the output resistors $R_1$ and the pROM outputs, or as currents flowing through the output resistors $R_1$.

The magnitude of $V_o$ is chosen so that if selected output lines are kept at ground potential (i.e. $R_1 = 0$), sufficient current will flow through the SE associated with the selected address and output lines to blow the fuse into its open state. The value of $R_1$ is chosen so that when an address line is accessed with a voltage of magnitude $V_o$, the current through the selected SE's for which the fuses are not blown will be limited to just above the threshold point for either the CNDR or the TS type of SE. Bias currents of this magnitude assure adequate sneak path protection but do not overly stress the fuses. Typical values for $V_o$ and $R_1$ are in the range from about 5 volts to about 15 volts and from about 2000 ohms to about 10,000 ohms, respectively.

A pROM in its initial state contains logical "1's" at all memory locations. Programming of the pROM takes place in the following sequence. The pROM 100 is connected into a circuit as shown in FIG. 7 and a selected address line is raised to voltage $V_o$. The load resistors associated with output bits which are to be made logical "0's" are momentarily shorted by switch means (not shown) associated with the resistor. This causes increased current to flow in the device. If a CNDR is utilized as the switching device and is biased into its negative resistance characteristic, positive feedback results in a sharp current surge in the fuse, causing this fuse to blow open cleanly. If a TS device is used, or abrupt transition to a low resistance state occurs, causing a current surge in the fuse, the sharp current surges occur notwithstanding the fact that the applied voltage pulse $V_o$ actually appears substantially as a ramp signal when applied to the device for the reasons explained heretofore. By reopening the short across the selected output load resistors, the new output word (with some programmed "0's") can be read.

Since the substrate used in the pROM device does not play an electrically active role, it can act as the support member for the addressing means. For example, a pROM device array could be prepared directly on a board containing an array of switches such as used in data entry keyboards. The function of the pROM would be to encode the keyboard to provide, for example, ASCII output.

Alternatively, the pROM could be fabricated on a substrate of moderate dimensions (e.g. 3"×4") and provided with edge connectors to mate to conventional printed circuit board edge connector sockets to form an inexpensive memory having many applications.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. A Read only memory comprising:
   a matrix of first and second sets of conductors the cross-points of which are connected by non-crystalline semiconductor switches in series with a fuse, each of said switching devices having a symmetrical voltage-current (V-I) characteristic regardless of polarity state and comprises in either polarity state a non-linear high resistance state region and a negative differential low resistance state region, selected ones of said fuses being opened by driving their corresponding switches into said negative differential low resistance state region to provide a rapid rise of current through said fuse whereby a plurality of data words are stored in said memory, and
   means for applying a signal of a predetermined magnitude to the input terminal of a preselected conductor of either said first or second set of conductors whereby a signal corresponding to a predetermined data word is provided at the output terminals of the other set of conductors.

2. The read only memory as set forth in claim 1 wherein the V-I characteristic of said switching devices includes a negative differential resistance region between said non-linear high resistance state region and said low resistance state region.

3. The read only memory as defined in claim 1 wherein the low resistance state region of said V-I characteristic is an abrupt transition from said non-linear high resistance state region.

4. The read only memory as defined in claim 1 wherein said first set of conductors comprises n conductors corresponding to n-address lines, each address line has an input terminal associated therewith, and wherein said second set of conductors comprises m conductors corresponding to words of m-bit length, each m conductor having an output terminal associated therewith.

5. The read only memory of claim 4 wherein said signal of a predetermined magnitude is applied to one of said n-address lines, said data word appearing at said output terminals as a m-bit length word.

6. The read only memory of claim 4 wherein said signal of a predetermined magnitude is applied to one of said output terminals, said data word appearing at said input terminals as a n-bit length word.

7. The read only memory as defined in claim 1 wherein said semiconductor switches and fuses are fabricated utilizing thin-film techniques.

8. A programmable read only memory comprising:
   a matrix of first and second sets of conductors the cross-points of which are connected by non-crystalline semiconductor switches in series with a fuse, each of said switching devices having a symmetrical voltage-current characteristic regardless of polarity and comprises in either polarity state, a non-linear high resistance state region and a negative differential low resistance state region, said first set of conductors having a plurality of input terminals associated therewith and said second set of conductors having a plurality of output terminals associated therewith, and
   means for applying a signal of sufficient magnitude to a selected input terminal whereby a current is caused to flow to selected output terminals causing the fuse associated with the selected input terminal and output terminals to be placed in an open state, said negative differential low resistance state region of said switches being such that a rapid rise in current flows through the fuse causing the fuse to be permanently open, representing a data word stored in said memory.

9. The programmable read-only memory of claim 8 further including means for reading said stored data word by applying a signal of a predetermined magnitude to said selected input terminal whereby said data word appears at said output terminals.

10. The programmable read-only memory of claim 9 wherein a plurality of data words are stored in said memory.

11. A memory matrix comprising an insulating base, a matrix of first and second groups of conductors deposited as a film on one side of said base and arranged so that each conductor of one group crosses over the conductors of the second group forming a plurality of cross points, a switching element at each cross point and comprising a current controlled negative resistance device in series with a fuse, said current controlled negative resistance device having a non-linear high resistance state below a threshold voltage level and a negative differential low resistance state when the applied voltage reaches or exceeds said threshold voltage, said series connected fuse being cleanly placed in an open circuit state by a sudden current rise produced when said current controlled resistance device is driven above said threshold level into said negative different low resistance state causing a rapid rise in fusing temperature which is proprotional to the square of said current rise.

12. The memory matrix of claim 11 wherein said current controlled resistance device includes a transition through a negative differential resistance region between said non-linear high resistance state and said low resistance state upon being driven above said threshold level.

13. The memory matrix of claim 11 wherein said current controlled resistance device region includes an abrupt transition from said non-linear high resistance state upon being driven about said threshold level.

14. The matrix of claim 11 wherein said first group of conductors has a plurality of input terminals associated therewith and said group of conductors has a plurality of output terminals associated therewith, programming means connected to the input and output terminals of said matrix and including addressing means for applying a signal of threshold voltage level to selected of said input terminals and a resistance load factor in selected of said output terminals whereby the fuses of selected cross point switching elements are changed to an open circuit state.

* * * * *

UNITED STATES PATENT AND TRADEMARK OFFICE
CERTIFICATE OF CORRECTION

PATENT NO. : 4,162,538
DATED : July 24, 1979
INVENTOR(S) : David D. Thornburg

It is certified that error appears in the above-identified patent and that said Letters Patent are hereby corrected as shown below:

Column 8, line 44, "different" should be -- differential --

Column 8, line 57, "about" should be -- above --

Signed and Sealed this

Thirtieth Day of October 1979

[SEAL]

Attest:

RUTH C. MASON
Attesting Officer

LUTRELLE F. PARKER
Acting Commissioner of Patents and Trademarks